(12) United States Patent
Cominetti et al.

(10) Patent No.: US 11,374,186 B2
(45) Date of Patent: Jun. 28, 2022

(54) POLYMER PHOTOVOLTAIC CELL WITH AN INVERTED STRUCTURE AND PROCESS FOR ITS PREPARATION

(71) Applicant: ENI S.P.A., Rome (IT)

(72) Inventors: Alessandra Cominetti, Novara (IT); Riccardo Po, Novara (IT)

(73) Assignee: ENI S.P.A., Rome (IT)

( * ) Notice: Subject to any disclaimer, the term of this patent is extended or adjusted under 35 U.S.C. 154(b) by 507 days.

(21) Appl. No.: 16/466,492

(22) PCT Filed: Feb. 21, 2018

(86) PCT No.: PCT/IB2018/051045
§ 371 (c)(1),
(2) Date: Jun. 4, 2019

(87) PCT Pub. No.: WO2018/154444
PCT Pub. Date: Aug. 30, 2018

(65) Prior Publication Data
US 2020/0067003 A1 Feb. 27, 2020

(30) Foreign Application Priority Data
Feb. 23, 2017 (IT) .................. 102017000020775

(51) Int. Cl.
*H01L 31/044* (2014.01)
*H01L 51/42* (2006.01)
(Continued)

(52) U.S. Cl.
CPC .......... *H01L 51/4233* (2013.01); *C01G 39/02* (2013.01); *H01L 51/0037* (2013.01);
(Continued)

(58) Field of Classification Search
CPC ..... H01L 31/00–078; H01L 51/42–448; H01L 2031/0344; Y02E 10/50–60
(Continued)

(56) References Cited

U.S. PATENT DOCUMENTS

2013/0313534 A1  11/2013  Liu et al.
2014/0231795 A1*  8/2014  Otsuki ................ H01L 51/0005
                                                      252/500

FOREIGN PATENT DOCUMENTS

GB        2486203 A       6/2012
JP     2005-294303 A     10/2005
(Continued)

OTHER PUBLICATIONS

Jia et al., ACS Appl. Mater. Interfaces, 2015, , 5367-5372 (Year: 2015).*
Ohisa et al., ACS Appl. Mater. Interfaces, 2016, 8, 20946-20954 (Year: 2016).*
(Continued)

*Primary Examiner* — Bach T Dinh
(74) *Attorney, Agent, or Firm* — Husch Blackwell LLP

(57) ABSTRACT

Polymeric photovoltaic cell (or solar cell) with an inverted structure comprising: an anode; a first anode buffer layer; an active layer comprising at least one photoactive organic polymer as the electron donor and at least one organic electron acceptor compound; a cathode buffer layer; a cathode; wherein between said first anode buffer layer and said active layer a second anode buffer layer is placed comprising a hole transporting material, said hole transporting material being obtained through a process comprising: reacting at least one heteropoly acid containing at least one transition metal belonging to group 5 or 6 of the Periodic Table of the Elements; with at least an equivalent amount of a salt or a complex of a transition metal belonging to group 5 or 6 of the Periodic Table of the Elements with an organic anion, or (Continued)

with an organic ligand; in the presence of at least one organic solvent selected from alcohols, ketones, esters, preferably alcohols. Said polymer photovoltaic cell (or solar cell) with an inverted structure displays high photoelectric conversion efficiency values ($\eta$), i.e. a photoelectric conversion efficiency ($\eta$) greater than or equal to 4.5%, and good open circuit voltage (Voc), short-circuit current density (Jsc) and fill factor (FF) values. Furthermore, said polymer photovoltaic cell (or solar cell) with an inverted structure is able to maintain said values over time, in particular, in terms of photoelectric conversion efficiency ($\eta$).

19 Claims, 1 Drawing Sheet

(51) Int. Cl.
    *C01G 39/02*     (2006.01)
    *H01L 51/00*     (2006.01)
    *H01L 51/50*     (2006.01)

(52) U.S. Cl.
    CPC ...... *H01L 51/0039* (2013.01); *H01L 51/0047* (2013.01); *H01L 51/5056* (2013.01); *H01L 2251/306* (2013.01); *H01L 2251/308* (2013.01)

(58) Field of Classification Search
    USPC .................................................. 136/243–265
    See application file for complete search history.

(56) References Cited

FOREIGN PATENT DOCUMENTS

WO      2016/208596 A1      12/2016
WO      2017/010847 A2      1/2017

OTHER PUBLICATIONS

Zhu et al., J. Mater. Chem. A, 2014, 2, 1436-1442 (Year: 2014).*
Kim et al., Electron. Mater. Lett., 2016, vol. 12, No. 3, 383-387 (Year: 2016).*
Zhu Yawen et al: "A cost-effective commercial soluble oxide cluster for highly efficient and stable organic solar cells", Journal of Materials Chemistry A, vol. 2, No. 5, Jan. 1, 2014 (Jan. 1, 2014), pp. 1436-1442, XP055797867, GB ISSN: 2050-7 488, DOI: 10.1039/C3TA 13762G.
International Search Report and Written Opinion for International Appln. No PCT/IB2008/051045 dated Jun. 8, 2018, 12 pages.

* cited by examiner

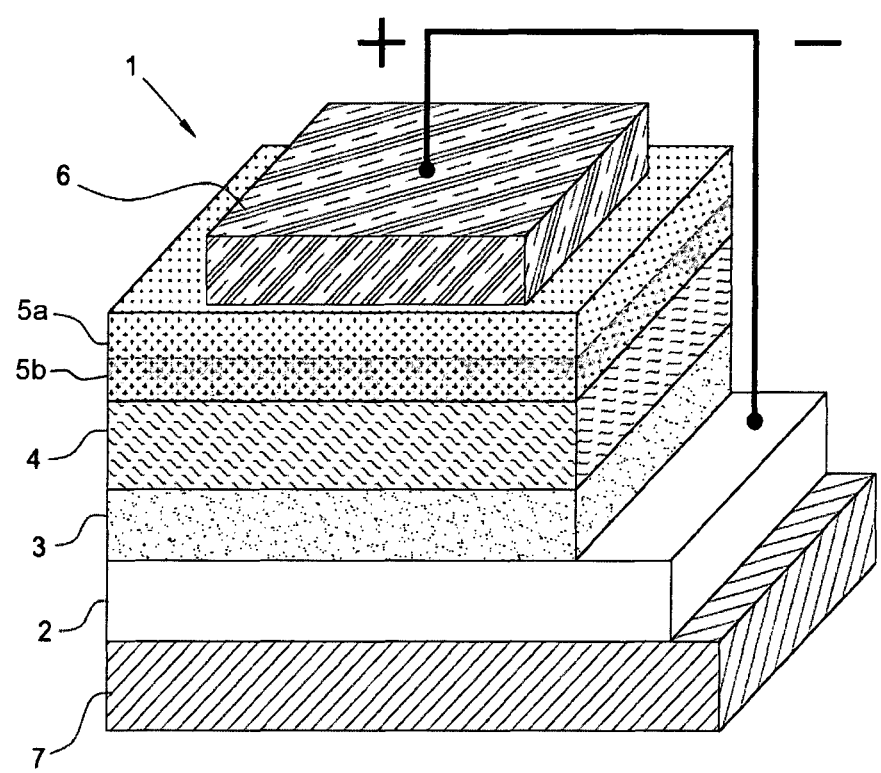

POLYMER PHOTOVOLTAIC CELL WITH AN INVERTED STRUCTURE AND PROCESS FOR ITS PREPARATION

The present invention relates to a polymer photovoltaic cell (or solar cell) with an inverted structure.

More in particular, the present invention relates to a polymer photovoltaic cell (or solar cell) with an inverted structure comprising a first anode buffer layer and a second anode buffer layer, wherein said second anode buffer layer comprises a hole transporting material, said hole transporting material being obtained through a process comprising: reacting at least one heteropoly acid containing at least one transition metal belonging to group 5 or 6 of the Periodic Table of the Elements, with at least an equivalent amount of a salt or a complex of a transition metal belonging to group 5 or 6 of the Periodic Table of the Elements with an organic anion, or with an organic ligand, in the presence of at least one organic solvent selected from alcohols, ketones, esters, preferably alcohols. Said polymer photovoltaic cell (or solar cell) with an inverted structure displays high photoelectric conversion efficiency values ($\eta$), i.e. a photoelectric conversion efficiency ($\eta$) greater than or equal to 4.5%, and good open circuit voltage (Voc), short-circuit current density (Jsc) and fill factor (FF) values. Furthermore, said polymer photovoltaic cell (or solar cell) with an inverted structure is able to maintain said values over time, in particular, in terms of photoelectric conversion efficiency ($\eta$).

The present invention also relates to a process for preparing the aforesaid polymer photovoltaic cell (or solar cell) with an inverted structure.

Photovoltaic devices (or solar devices) are devices able to convert the energy of light radiation into electrical energy. Currently, most of the photovoltaic devices (or solar devices) that can be used for practical applications exploit the chemical/physical properties of inorganic photoactive materials, in particular highly pure crystalline silicon. Due to the high production costs of silicon, however, scientific research has been focusing for some time on the development of alternative organic materials having a polymer structure [the so-called polymer photovoltaic cells (or solar cells)]. In fact, unlike highly pure crystalline silicon, said organic materials are characterized in that they are relatively easy to synthesize, cheap to produce and the related organic photovoltaic device (or solar device) has a lower weight, as well as allowing said organic materials to be recycled at the end of the life cycle of the device in which they are used.

The above-mentioned advantages therefore make the use of said organic materials energetically and economically attractive despite the possible lower photoelectric conversion efficiency ($\eta$) of the solar radiation of the organic photovoltaic devices (or solar devices) obtained with respect to inorganic photovoltaic devices (or solar devices).

The operation of organic photovoltaic devices (or solar devices), such as polymer photovoltaic cells (or solar cells), is based on the combined use of an electron acceptor compound and an electron donor compound.

In the state of the art, the most commonly used electron donor compound for the production of polymer photovoltaic cells (or solar cells) is regioregular poly(3-hexylthiophene) (P3HT). This polymer has excellent electronic and optical characteristics [e.g. good HOMO and LUMO orbital values, a good molar absorption coefficient ($\varepsilon$)], good solubility in the solvents used to produce polymer photovoltaic cells (or solar cells) and reasonable mobility of electron holes.

Some examples of polymers that can be advantageously used as electron donor compounds are: the polymer PCDTBT {poly[N-9"-heptadecanyl-2,7-carbazole-alt-5,5-(4',7'-di-2-thenyl-2',1',3'-benzothiadiazol]}, the polymer PCPDTBT {poly[2,6-(4,4-bis-(2-ethylhexyl)-4H-cyclopenta[2,1-b:3,4-b']-dithiophene)-alt-4,7-(2,1,3-benzothiadiazole)]}, the polymer PffBT4T-2OD {poly[(5,6-difluoro-2,1,3-benzothiadiazole-4,7-diyl)-alt-(3,3'''-di(2-octyldodecyl)-2,2';5',2'';5'',2'''-quaterthiophene-5,5'''-diyl)]}.

In the state of the art, the electron acceptor compounds most frequently used in the construction of polymer photovoltaic cells (or solar cells) are fullerene derivatives such as, for example, [6,6]-phenyl-$C_{61}$-butyric acid methyl ester (PCBM), (6,6)phenyl-$C_{71}$-butyric acid methyl ester (PC71BM). Said fullerene derivatives have led to the highest photoelectric conversion efficiencies ($\eta$) when mixed with electron donor compounds selected from $\pi$-conjugated polymers such as, for example, polythiophenes ($\eta > 5\%$), polycarbazoles ($\eta > 6\%$), derivatives of poly(thienothiophene)benzodithiophene (PTB) ($\eta > 8\%$), fluorinated polymers of benzothiadiazole ($\eta > 10\%$).

The elementary conversion process of light into electrical current in a polymer photovoltaic cell (or solar cells) takes place through the following steps:
1. absorption of a photon by the electron donor compound with the formation of an exciton, i.e. a pair of electron-electron hole (or hole) charge carriers;
2. diffusion of the exciton in a region of the electron donor compound up to the interface with the electron acceptor compound, in which its dissociation can take place;
3. dissociation of the exciton in the two charge carriers: electron (−) in the accepting phase (i.e. in the electron acceptor compound) and electron hole (or hole) (+) in the donating phase (i.e. in the electron donor compound);
4. carrying the charges thus formed to the cathode [electron (−) through the electron acceptor compound] and to the anode [electron hole (or hole) (+) through the electron donor compound], with the generation of an electric current in the polymer photovoltaic cell (or solar cell) circuit.

The photoabsorption process with the formation of the exciton and subsequent loss of an electron to the electron acceptor compound implies the excitation of an electron from the HOMO (Highest Occupied Molecular Orbital) to the LUMO (Lowest Unoccupied Molecular Orbital) of the electron donor compound and, subsequently, the transfer from this to the LUMO of the electron acceptor compound.

Since the efficiency of a polymer photovoltaic cell (or solar cell) depends on the number of free electrons generated by dissociation of the excitons, one of the structural characteristics of electron donor compounds that has the greatest effect on such efficiency is the difference in energy between the HOMO and LUMO orbitals of the electron donor compound, (the so-called band-gap). This difference depends in particular on the wavelength of the photons that the electron donor compound is able to harvest and effectively convert into electrical energy, (the so-called photon harvesting or light harvesting process).

From the point of view of the electronic characteristics, improvements in relation to the materials used in the construction of polymer photovoltaic cells (or solar cells) are possible through the design of the molecular structure of the electron donor compound and of the electron acceptor compound for the purpose of tuning the energy levels (HOMO-LUMO) of both in an optimal way. In particular, in order to obtain the dissociation of the exciton formed in the process and prevent the charge recombination, it is necessary for the difference both between the HOMOs of the electron donor compound and of the electron acceptor compound, and between the LUMOs of the electron donor compound and the electron acceptor compound, to have an optimal value ranging from 0.3 eV to 0.5 eV. Furthermore, the band gap, i.e. the difference in energy between the HOMO and LUMO of the electron donor compound, must on one hand not be too high so as to allow the absorption of the highest number of photons but, on the other hand, not be too low as this could reduce the voltage at the electrodes of the polymer photovoltaic cell (or solar cell).

Another important characteristic of the materials used in the construction of polymer photovoltaic cells (or solar cells) is the mobility of the electrons in the electron acceptor compound and of the electron holes (or holes) in the electron donor compound, which leads to the ease with which the electric charges, once photogenerated, reach the electrodes.

The electron mobility, i.e. the mobility of the electrons in the electron acceptor compound and of the electron holes (or holes) in the electron donor compound, as well as being an intrinsic property of the molecules, is also strongly influenced by the morphology of the active layer that contains them, which in turn depends on the mutual miscibility of the compounds used in said active layer and on their solubility. For that purpose, the phases of said active layer must not be either too dispersed or too segregated.

The morphology of the active layer is also critical in relation to the effectiveness of the dissociation of the electron hole (hole)-electron pairs photogenerated. In fact, the average lifetime of the exciton is such that it can diffuse into the organic material for an average distance of no more than 10 nm-20 nm. Consequently, the phases of the electron donor compound and of the electron acceptor compound must be organized in nanodomains of comparable dimensions with this diffusion distance. Furthermore, the area of contact between the electron donor compound and the electron acceptor compound must be as large as possible and there must be preferential paths towards the electrical contacts. Furthermore, such morphology must be reproducible and not change over time.

In the simplest operating method, the polymer photovoltaic cells (or solar cells) are made by introducing between two electrodes, usually made of indium tin oxide (ITO) (anode) and aluminum (Al) (cathode), a thin layer (about 100 nanometers) of a mixture of the electron acceptor compound and the electron donor compound [bulk heterojunction]. Generally, for the purpose of creating a layer of this type, a solution of the two compounds (i.e. electron acceptor compound and electron donor compound) is prepared and, subsequently, an active layer is created on the anode [indium tin oxide (ITO)] based on said solution, making use of appropriate application techniques, such as spin-coating, spray-coating, ink-jet printing, slot die coating, gravure printing, screen printing, and the like. Finally, the counter electrode [i.e. the aluminum cathode (Al)] is deposited on the dried active layer through known techniques, for example, through evaporation. Optionally, between the anode and the active layer and/or between the cathode and the active layer, other additional layers can be introduced (known as buffer layers) able to perform specific functions of an electric, optical or mechanical nature.

Generally, for example, for the purpose of helping the electron holes (or holes) to reach the anode [indium tin oxide (ITO)] and at the same time to stop electrons being carried, ence improving the charge harvesting by the anode and inhibiting recombination phenomena, before creating the active layer starting from the mixture of the electron acceptor compound and the electron donor compound as described above, a layer is deposited, based on an aqueous suspension comprising PEDOT:PSS [poly(3,4-ethylenedioxythiophene):polystyrene sulfonate], making use of appropriate application techniques such as, for example, spin-coating, spray-coating, ink-jet printing, slot die coating, gravure printing, screen printing, and the like.

More details on the different deposition techniques can be found, for example, in Krebs F. C., in "*Solar Energy Materials & Solar Cells*" (2009), Vol. 93, pag. 394-412.

The polymer photovoltaic cells (or solar cells) with an inverted structure, generally mentioned in literature comprise, instead, the following layers: (i) a support made of transparent material; (ii) an indium tin oxide (ITO) cathode; (iii) a cathode buffer layer that has the function of electrons carrier and of electron holes (or holes) barrier, generally comprising zinc oxide; (iv) an active layer comprising an electron donor compound and an electron acceptor compound generally selected from those mentioned above; (v) an anode buffer layer that has the function of electron holes (or holes) carrier and of electron barrier comprising a hole transporting material, generally selected from molybdenum oxide, tungsten oxide, vanadium oxide, (vi) an anode, generally made of silver (Ag), gold (Au) or aluminum (Al).

Generally, for the purpose of protecting said polymer photovoltaic cells (or solar cells), either with traditional architecture, or with an inverted structure, from mechanical stress and from atmospheric agents, and for their use in real conditions, said photovoltaic cells (or solar cells) are encapsulated with an appropriate material [for example, hybrid multilayer films based on polyethylene terephthalate), inorganic oxides].

Generally, the aforementioned anode buffer layer is obtained through a deposition process of the molybdenum oxide (or, alternatively, of the tungsten or vanadium oxide) performed through vacuum evaporation of said molybdenum oxide, at high temperature and high vacuum (for example, $10^{-5}$ mm Hg-$10^{-7}$ mm Hg). However, said deposition process has some drawbacks such as, for example: long times as the deposition chamber needs to be brought to the required pressures and sufficient time is needed to reach the necessary material thickness for the operation of the final photovoltaic cell (or solar cell) and, therefore, longer process times and an increase in process costs; high energy consumptions; significant waste of material mainly due to the fact that the oxide vapors fill the deposition chamber and are deposited uniformly on a much larger surface area than the effectively needed one, corresponding to the final photovoltaic cell (or solar cell).

In order for the aforementioned polymer photovoltaic cells (or solar cells) with an inverted structure to be used in large scale industrial application, it is therefore necessary for suitable production processes to be developed, able to overcome the aforementioned disadvantages. Efforts have therefore been made for this purpose.

For example, Välimäki M. et al., in "*Nanoscale*" (2015), Vol. 7, pag. 9570-9580, describe a process for manufacturing organic photovoltaic (OPV) modules with an inverted structure through roll-to-roll (R2R) printing using the following deposition techniques: gravure printing and rotary screen-printing. In said organic photovoltaic (OPV) modules with an inverted structure the anode buffer layer comprises PEDOT:PSS [poly(3,4-ethylenedioxythiophene):polystyrene sulfonate] and is obtained through rotary screen-printing.

However, as reported, for example, by Dkhil S. B. et al., in "*Advanced Energy Materials*" (2016), Vol. 6, 1600290, the use of anode buffer layers comprising different materials from molybdenum oxide generally causes a reduction in the efficiencies of the organic solar cells obtained: in fact, organic solar cells in which the anode buffer layer is obtained through a deposition process of the molybdenum oxide performed by vacuum evaporation of said molybdenum oxide, can reach efficiencies greater than 9%.

Furthermore, the use of PEDOT:PSS [poly(3,4-ethylenedioxythiophene):polystyrene sulfonate], generally in aqueous suspension or in mixed water/alcohol solvents, as the material for the anode buffer layer, has some disadvantages from a practical point of view, known to a person skilled in the art. The first disadvantage is represented by the strong acidity of the solution used which generally has a pH equal to 2 or 3, leading to long-term instability of the polymer photovoltaic cells (or solar cells), caused by the gradual corrosion of the anode with which said anode buffer layer is in contact, or of the cathode, following the slow diffusion of the $H^+$ ions through the active layer. A second disadvantage is represented by the fact that the aqueous suspension has very poor wettability properties with respect to the active layer: this causes a non-uniform cover of the layer itself and therefore a reduction of the effectiveness of the anode buffer layer in its action as an electron hole carrier layer. It is possible to overcome this disadvantage by changing said suspension with the addition of appropriate surfactants but this, on one hand, leads to an increase in the cost of the material and, on the other, to a reduction in conductivity of said anode buffer layer, since the surfactants behave like electrical insulators.

Therefore, the use of PEDOT:PSS [poly(3,4-ethylenedioxythiophene):polystyrene sulfonate], is not an optimal solution in the manufacturing of polymer photovoltaic cells (or solar cells) and it is therefore of great interest to identify alternative routes.

Among the alternative materials to PEDOT:PSS [poly(3,4-ethylenedioxythiophene):polystyrene sulfonate] proposed by the scientific community, for example soluble derivatives of molybdenum or vanadium can be cited. For example, Xu M.-F. et al., in "*Organic Electronics*" (2013), Vol. 14, pag. 657-664, describe the use of an aqueous solution of molybdenum oxide ($MoO_3$) as the anode buffer layer in conventional organic solar cells [comprising poly(3-hexylthiophene) (P3HT) and fullerene] with a bulk heterojunction. However, this solution cannot be used in organic solar cells with an inverted structure, since said aqueous solution would not be able to suitably wet the active layer.

Liu J. et al., in "*Journal of Materials Chemistry C*" (2014), Vol. 2, pag. 158-163, describe the use of a molybdenum oxide ($MoO_3$) solution in ammonia-water as an anode buffer layer that is deposited on the anode [indium-tin oxide (ITO)] through spin-coating and subsequently subjected to annealing at 150° C., for 20 minutes. Said solution is also used in conventional organic solar cells [comprising poly(3-hexylthiophene) (P3HT) and fullerene] with a bulk heterojunction and cannot be used in organic solar cells with an inverted structure due to the same drawbacks described above. Furthermore, the aforementioned annealing is performed at a temperature that is not compatible with the use of flexible plastic supports or for too long for a high speed deposition process (10 m-50 m per minute).

Murase S. et al., in "*Advanced Materials*" (2012), Vol. 24, pag. 2459-2462, describe the use of a $MoO_3$ solution obtained by thermal decomposition, in deionized water, of ammonium heptamolybdate as a precursor, as the anode buffer layer that is deposited on the anode [indium-tin oxide (ITO)] through spin-coating. Also in this case the solution is used in conventional organic solar cells (i.e. without an inverted structure) because of the wettability problems of the active layer.

Hammond S. R. et al., in "*Journal of Materials Chemistry*" (2012), Vol. 22, pag. 3249-3254, describe the use of a molybdenum oxide ($MoO_x$) solution obtained by thermal decomposition, in acetonitrile, of tricarbonyltris(propionitrile)molybdenum as a precursor, as the anode buffer layer that is deposited on the anode [indium-tin oxide (ITO)] through spin-coating. The solution in tricarbonyltris(propionitrile) molybdenum is prepared in an inert atmosphere due to the instability of said precursor. Said instability, the very high cost of the precursor and the known toxicity of metallocarbonyl derivatives, make the process described therein not suitable for use in a large-scale industrial process.

Zilberg K. et al., in "*Applied Materials & Interfaces*" (2012), Vol. 4, pag. 1164-1168, describe the use of a solution of $MoO_x$ obtained by thermal decomposition, in iso-propanol (containing about 0.1% water), of bis(2,4-pentanedionate)molybdenum(IV)dioxide as a precursor, as the anode buffer layer that is deposited on the anode (Ag) through spin-coating and subsequently subjected to annealing at 110° C., for 1 hour. These times are absolutely incompatible with a high speed deposition process (10 m-50 m per minute). Zhu Y. et al., in "*Journal of Materials Chemistry A*" (2014), Vol. 2, pag. 1436-1442, describe the use of a solution of phosphomolybdic acid (PMA), in iso-propanol, as an anode buffer layer that is deposited on the anode (Ag) through spin-coating and subsequently subjected to annealing at 150° C., for 90 minutes. The organic solar cells with an inverted structure comprising said buffer layer are said to have efficiencies that are comparable or slightly higher than those of solar cells with an inverted structure comprising an anode buffer layer obtained through a deposition process of molybdenum oxide performed through evaporation of said molybdenum oxide. However, the intrinsic acidity of phosphomolybdic acid represents a potentially corrosive element for the organic solar cells obtained. Furthermore, the long times for performing said heat treatment are not compatible with a roll-to-roll (R2R) printing process.

Chinese patent application CN 103400941 relates to an organic solar cell based on a modified anode layer comprising: a cathode, a modified cathode buffer layer, a bulk heterojunction active layer, a modified anode buffer layer and an anode; wherein said modified anode buffer layer is based on a heteropoly acid having formula $H_x(MM'_{12}O_{40})$ wherein M is phosphorous (P) or silicon (Si), M' is molybdenum (Mo) or tungsten (W), X is 3 or 4; the cathode is indium tin oxide (ITO); the modified cathode buffer layer is zinc oxide; the bulk heterojunction active layer is a mixture of compounds such as poly(3-hexylthiophene) (P3HT) and fullerene; the anode is silver or aluminum. However, also in this case, the acidity of the heteropoly acid used as an anode buffer layer, represents a potentially corrosive element for the organic solar cell.

Vasilopoulou M. et al., in "*Journal of the American Chemical Society*" (2015), Vol. 137(21), pag. 6844-6856, describe the use of polyoxometalates (POM) of the Keggin and Dawson type as cathode buffer layers in high efficiency optoelectronic devices. Said cathode buffer layers act as electron carriers and hole blockers.

Kim J.-H. et al., in "*Electronic Materials Letters*" (2016), Vol. 12, No. 3, pag. 383-387, describe an organic solar cell with an inverted structure based on P3HT:PCBM having improved charge transporting properties thanks to the use of nanoparticles of molybdenum oxide ($MoO_3NPs$) as the hole transporting layer positioned between the active layer of P3HT:PCBM and the anode buffer layer of PEDOT:PSS [poly(3,4-ethylenedioxythiophene):polystyrene sulfonate]. Said organic solar cell has a photoelectric conversion efficiency ($\eta$) of 4.11% higher than that of an organic solar cell without the aforementioned hole transporting layer of nanoparticles of molybdenum oxide ($MoO_3NPs$) which is, in fact, equal to 3.70%.

The Applicant therefore has faced the problem of finding a polymer photovoltaic cell (or solar cell) with an inverted structure having better performance levels.

The Applicant has now found that the use of a first anode buffer layer and a second anode buffer layer, wherein said second anode buffer layer comprises a hole transporting material, said hole transporting material being obtained through a process comprising: reacting at least one heteropoly acid containing at least one transition metal belonging to group 5 or 6 of the Periodic Table of the Elements, with at least an equivalent amount of a salt or a complex of a transition metal belonging to group 5 or 6 of the Periodic Table of the Elements with an organic anion, or with an organic ligand, in the presence of at least one organic solvent selected from alcohols, ketones, esters, preferably alcohols, allows a polymer photovoltaic cell (or solar cell) with an inverted structure having improved performance levels to be obtained. In particular, the Applicant has now found that the use of said first anode buffer layer and second anode buffer layer allows a polymer photovoltaic cell (or solar cell) with an inverted structure to be obtained having high photoelectric conversion efficiency values ($\eta$), i.e. a photoelectric conversion efficiency ($\eta$) greater than or equal to 4.5%, and good open circuit voltage (Voc), short-circuit current density (Jsc) and fill factor (FF) values. Furthermore, said polymer photovoltaic cell (or solar cell) with an inverted structure is able to maintain said values over time, in particular, in terms of photoelectric conversion efficiency ($\eta$).

Therefore, the subject matter of the present invention is a polymer photovoltaic cell (or solar cell) with an inverted structure comprising:
- an anode;
- a first anode buffer layer;
- an active layer comprising at least one photoactive organic polymer as the electron donor and at least one organic electron acceptor compound;
- a cathode buffer layer;
- a cathode;
- wherein between said first anode buffer layer and said active layer a second anode buffer layer is placed comprising a hole transporting material, said hole transporting material being obtained through a process comprising:
  - reacting at least one heteropoly acid containing at least one transition metal belonging to group 5 or 6 of the Periodic Table of the Elements; with
  - at least an equivalent amount of a salt or a complex of a transition metal belonging to group 5 or 6 of the Periodic Table of the Elements with an organic anion, or with an organic ligand;
- in the presence of at least one organic solvent selected from alcohols, ketones, esters. For the purpose of the present description and of the following claims, the definitions of the numeric ranges always include the extremes unless specified otherwise.

For the purpose of the present description and of the following claims, the term "Periodic Table of the Elements" refers to the "IUPAC Periodic Table of the Elements", version dated 8 Jan. 2016, available on the following website: https://iupac.org/what-we-do/periodic-table-of-elements/.

For the purpose of the present description and of the following claims, the term "transition metal belonging to group 5 or 6 of the Periodic Table of the Elements" means metals belonging to said group 5 or 6, excluding transuranic metals.

For the purpose of the present invention, any salt or complex of a transition metal belonging to group 5 or 6 of the Periodic Table of the Elements can be used with an organic anion or with an organic ligand as long as it is soluble in the selected organic solvent.

For the purpose of the present description and of the following claims, the term "soluble in the organic solvent" means that said salt or complex of a transition metal belonging to group 5 or 6 of the Periodic Table of the Elements with an organic anion or with an organic ligand has a dissociation constant such as to make the cation available for the reaction.

For the purpose of the present description and of following claims, the terms first anode buffer layer and second anode buffer layer are to be considered indicated as such as a simple order of description and not as an order of deposition during the process for preparing said polymer photovoltaic cell (or solar cell) with an inverted structure described below.

In accordance with a preferred embodiment of the present invention, said anode may be made of metal, said metal preferably being selected, for example, from silver (Ag), gold (Au), aluminum (Al); or it may be constituted by grids of conductive material, said conductive material preferably being selected, for example, from silver (Ag), copper (Cu), graphite, graphene, and by a transparent conductive polymer, said transparent conductive polymer preferably being selected from PEDOT:PSS [poly(3,4-ethylenedioxythiophene):polystyrene sulfonate], polyaniline (PANI); or it may be constituted by a metal nanowire-based ink, said metal preferably being selected, for example, from silver (Ag), copper (Cu).

Said anode can be obtained by depositing said metal onto said first anode buffer layer through deposition techniques known in the state of the art, such as vacuum evaporation, flexographic printing, knife-over-edge-coating, spray-coating, screen-printing. Alternatively, said anode can be obtained through deposition on said first anode buffer layer of said transparent conductive polymer through spin coating, or gravure printing, or flexographic printing, or slot die coating, followed by deposition of said grids of conductive material via evaporation, or screen-printing, or spray-coating, or flexographic printing. Alternatively, said anode can be obtained through deposition on said first anode buffer layer of said metal nanowire-based ink through spin coating, or gravure printing, or flexographic printing, or slot die coating.

In accordance with a preferred embodiment of the present invention, said first anode buffer layer can be selected, for example, from PEDOT:PSS [poly(3,4-ethylenedioxythiophene):polystyrene sulfonate], polyaniline (PANI), preferably PEDOT:PSS [poly(3,4-ethylenedioxythiophene):polystyrene sulfonate].

Dispersions or solutions of PEDOT:PSS [poly(3,4-ethylenedioxythiophene):polystyrene sulfonate] that can be advantageously used for the purpose of the present invention and that are currently available on the market are the products Clevios™ by Heraeus, Orgacon™ by Agfa.

For the purpose of improving the deposition and the properties of said first anode buffer layer, one or more additives can be added to said dispersions or solutions such as, for example: polar solvents, such as alcohols (for example, methanol, ethanol, propanol), dimethylsulfoxide, or mixtures thereof; anionic surfactants such as, for example, carboxylates, α-olefin sulfonate, alkylbenzene sulfonates, alkyl sulfonates, esters of alkyl ether sulfonates, triethanolamine alkyl sulfonate, or mixtures thereof; cationic surfactants such as, for example, alkyltrimethylammonium salts, dialkyldimethylammonium chlorides, alkyl-pyridine chlorides, or mixtures thereof; ampholytic surfactants such as, for example, alkyl carboxybetaine, or mixtures thereof; non-ionic surfactants such as, for example, carboxylic diethanolamides, polyoxyethylene alkyl ethers, polyoxyethylene alkyl phenyl ethers, or mixtures thereof; polar compounds (for example, imidazole), or mixtures thereof; or mixtures thereof. More details on the addition of said additives can be found, for example, in: Synooka O. et al., "ACS Applied Materials & Interfaces" (2014), Vol. 6(14), pag. 11068-11081; Fang G. et al., "*Macromolecular Chemistry and Physics*" (2011), Vol. 12, Issue 17, pag. 1846-1851.

Said first anode buffer layer can be obtained by depositing the PEDOT:PSS [poly(3,4-ethylenedioxythiophene):polystyrene sulfonate], or polyaniline (PANI), in the form of a dispersion or solution, on the anode through deposition techniques known in the state of the art, such as vacuum evaporation, spin coating, drop casting, doctor blade casting, spin-coating, slot die coating, gravure printing, flexographic printing, knife-over-edge-coating, spray-coating, screen-printing.

In accordance with a preferred embodiment of the present invention, said photoactive organic polymer can be selected, for example, from:

(a) polythiophenes such as, for example, poly(3-hexylthiophene) (P3HT) regioregular, poly(3-octylthiophene), poly(3,4-ethylenedioxythiophene), or mixtures thereof;

(b) conjugated alternating or statistical copolymers comprising:
   at least one benzotriazole unit (B) having general formula (Ia) or (Ib):

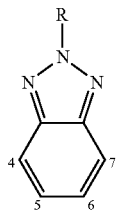

(Ia)

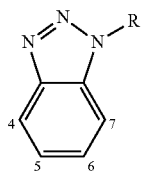

(Ib)

in which the group R is selected from alkyl groups, aryl groups, acyl groups, thioacyl groups, said alkyl, aryl, acyl and thioacyl groups being optionally substituted;
at least one conjugated structural unit (A), in which each unit (B) is connected to at least one unit (A) in any of positions 4, 5, 6, or 7, preferably in positions 4 or 7;

(c) conjugated alternating copolymers comprising benzothiadiazole units such as, for example, PCDTBT {poly[N-9'''-heptadecanyl-2,7-carbazole-alt-5,5-(4',7'-di-2-thienyl-2',1',3'-benzothiadiazole]}, PCPDTBT {poly[2,6-(4,4-bis-(2-ethylhexyl)-4H-cyclopenta [2,1-b; 3,4-b']-dithiophene)-alt-4,7-(2,1,3-benzotiadiazole)]};

(d) conjugated alternating copolymers comprising thieno[3,4-b]pyrazidine units;

(e) conjugated alternating copolymers comprising quinoxaline units;

(f) conjugated alternating copolymers comprising monomeric silylated units such as, for example, copolymers of 9,9-dialkyl-9-silafluorene;

(g) conjugated alternating copolymers comprising condensed thiophene units such as, for example, copolymers of thieno[3,4-b] thiophene and of benzo [1,2-b:4,5-b'] dithiophene;

(h) conjugated alternating copolymers comprising benzothiadiazole or naphthothiadiazole units substituted with at least one fluorine atom and thiophene units substituted with at least one fluorine atom such as, for example, PffBT4T-2OD {poly[(5,6-difluoro-2,1,3-benzothiadiazol-4,7-diyl)-alt-(3,3'''-(2-octyldodecyl)-2,2',5',2'';5''',2'''-quaterthiophene-5,5'''-dii)]}, PBTff4T-2OD {poly[(2,1,3-benzothiadiazole-4,7-diyl)-alt-(4',3''-difluoro-3,3'''-(2-octyldodecyl)-2,2';5',2'';5''',2'''-quaterthiophene-5,5'''-diyl)]}, PNT4T-2OD {poly(naphtho[1,2-c:5,-c']bis [1,2,5] thiadiazole-5,10-diyl)-alt-(3,3'''-(2-octyldodecyl)-2,2'; 5',2'';5''',2'''-quaterthiophene-5,5'''-diyl)];

(i) conjugated copolymers comprising thieno[3,4-c]pyrrole-4,6-dione units such as, for example, PBDTTPD {poly[[5-(2-ethylhexyl)-5,6-dihydro-4,6-dioxo-4H-thieno[3,4-c]pyrrole-1,3-diyl]][4,8-bis[(2-ethylhexyl)oxy]benzo[1,2-b:4,5-b'] dithiophene-2,6-diyl]};

(l) conjugated copolymers comprising thienothiophene units such as, for example, PTB7 {poly({4,8-bis[(2-ethylhexyl)oxy]benzo[1,2-b:4,5-b'] dithiophene-2,6-diyl}-{3-fluoro-2-[(2-ethylhexyl)carbonyl]thieno [3,4-b]thiophenediyl}};

(m) polymers comprising a derivative of indacen-4-one having general formula (III), (IV) or (V):

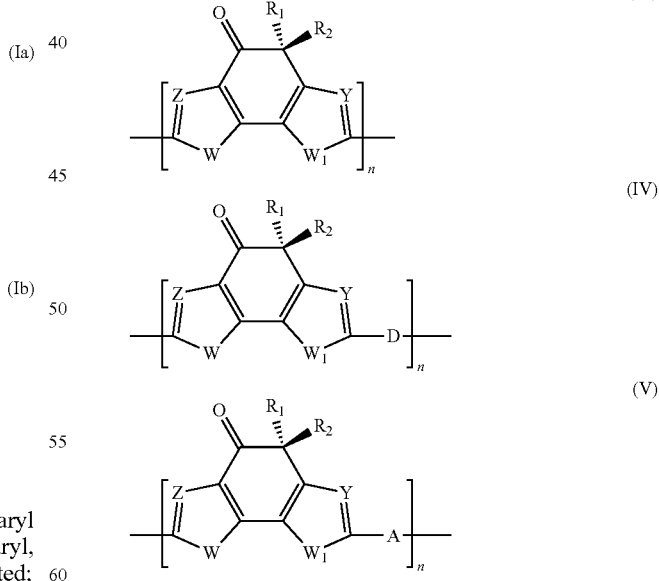

wherein:
W and $W_1$, identical or different, preferably identical, represent an oxygen atom; a sulfur atom; an N—$R_3$ group wherein $R_3$ represents a hydrogen atom, or is selected from linear or branched $C_1$-$C_{20}$ alkyl groups, preferably $C_2$-$C_{10}$;

Z and Y, identical or different, preferably identical, represent a nitrogen atom; or a C—R$_4$ group in which R$_4$ represents a hydrogen atom, or is selected from linear or branched C$_1$-C$_{20}$ alkyl groups, preferably C$_2$-C$_{10}$, optionally substituted cycloalkyl groups, optionally substituted aryl groups, optionally substituted heteroaryl groups, linear or branched C$_1$-C$_{20}$ alkoxy groups, preferably C$_2$-C$_{10}$, R$_5$—O—[CH$_2$—CH$_2$—O]$_n$— polyethylenoxyl groups in which R$_5$ is selected from linear or branched C$_1$-C$_{20}$ alkyl groups, preferably C$_2$-C$_{10}$, and n is an integer ranging from 1 to 4, —R$_6$—OR$_7$ groups in which R$_6$ is selected from linear or branched C$_1$-C$_{20}$ alkyl groups, preferably C$_2$-C$_{10}$, and R$_7$ represents a hydrogen atom or is selected from linear or branched C$_1$-C$_{20}$ alkyl groups, preferably C$_2$-C$_{10}$, or is selected from R$_5$—[—OCH$_2$—CH$_2$—]$_n$— polyethylenoxyl groups in which R$_5$ has the same meanings reported above and n is an integer ranging from 1 to 4, —COR$_8$ groups wherein R$_8$ is selected from linear or branched C$_1$-C$_{20}$ alkyl groups, preferably C$_2$-C$_{10}$; —COOR$_9$ groups in which R$_9$ is selected from linear or branched C$_1$-C$_{20}$ alkyl groups, preferably C$_2$-C$_{10}$; or represent a —CHO group, or a cyano group (—CN);

R$_1$ and R$_2$, identical or different, preferably identical, are selected from linear or branched C$_1$-C$_{20}$ alkyl groups, preferably C$_2$-C$_{10}$; optionally substituted cycloalkyl groups; optionally substituted aryl groups; optionally substituted heteroaryl groups; linear or branched C$_1$-C$_{20}$ alkoxy groups, preferably C$_2$-C$_{10}$; R$_5$—O—[CH$_2$—CH$_2$—O]$_n$— polyethylenoxyl groups in which R$_5$ has the same meanings reported above and n is an integer ranging from 1 to 4; —R$_8$—OR$_7$ groups in which R$_6$ and R$_7$ have the same meanings reported above; —COR$_8$ groups in which R$_8$ has the same meanings as above; or —COOR$_9$ groups in which R$_9$ has the same meanings as above; or represent a CHO group, or a cyano group (—CN);

D represents an electron-donor group;

A represents an electron acceptor group;

n is an integer ranging from 10 to 500, preferably ranging from 20 to 300.

More details on conjugated alternating or statistical copolymers (b) comprising at least one benzotriazole unit (B) and at least one conjugated structural unit (A) and on the process for their preparation can be found, for example, in international patent application WO 2010/046114 in the name of the Applicant.

More details on conjugated alternating copolymers comprising benzothiadiazole units (c), conjugated alternating copolymers comprising thieno[3,4-b]pyrazidine units (d), conjugated alternating copolymers comprising quinoxaline units (e), conjugated alternating copolymers comprising monomeric silylated units (f), conjugated alternating copolymers comprising condensed thiophene units (g), can be found, for example, in Chen J. et al., "*Accounts of chemical research*" (2009), Vol. 42, No. 11, pag. 1709-1718; Po' R. et al., "*Macromolecules*" (2015), Vol. 48(3), pag. 453-461.

More details on conjugated alternating copolymers comprising benzothiadiazole or naphtothiadiazole units substituted with at least one fluorine atom and thiophene units substituted with at least one fluorine atom (h) can be found, for example, in Liu Y. et al., "*Nature Communications*" (2014), Vol. 5, Article no. 5293 (DOI:10.1038/ncomms6293). More details on conjugated copolymers comprising thieno[3,4-c]pyrrole-4,6-dione units (i) can be found, for example, in Pan H. et al., "*Chinese Chemical Letters*" (2016), Vol. 27, Issue 8, pag. 1277-1282.

More details on conjugated copolymers comprising thienothiophene units (I) can be found, for example, in Liang Y. et al., "*Journal of the American Chemical Society*" (2009), Vol. 131(22), pag. 7792-7799; Liang Y. et al., "*Accounts of Chemical Research*" (2010), Vol. 43(9), pag. 1227-1236.

More details on polymers comprising a derivative of indacen-4-one (q) can be found, for example, in italian patent application MI2015A000676 in the name of the Applicant.

In accordance with a particularly preferred embodiment of the invention, said photoactive organic polymer may be selected, for example from: PffBT4T-2OD {poly[(5,6-difluoro-2,1,3-benzothiadiazol-4,7-diyl)-alt-(3,3''''-(2-octyldodecyl)-2,2',5',2'';5'',2'''-quaterthiophene-5,5'''-diyl)]}, PBDTTPD {{poly[[5-(2-ethylhexyl)-5,6-dihydro-4,6-dioxo-4H-thieno[3,4-c]pyrrole-1,3-diyl][4,8-bis[(2-ethylhexyl)oxy]benzo[1,2-b:4,5-b']dithiophene-2,6-diyl]}, PTB7 {poly({4,8-bis[(2-ethylhexyl)oxo]benzo[1,2-b:4,5-b']dithiophene-2,6-diyl}-{3-fluoro-2-[(2-ethylhexyl)carbonyl]thieno[3,4-b]thiophenediyl})}. PTB7 such as {poly({4,8-bis[(2-ethylhexyl)oxy]benzo[1,2-b:4,5-b']dithiophene-2,6-diyl}-{3-fluoro-2-[(2-ethylhexyl)carbonyl]thieno[3,4-b]thiophenediyl}} is preferred.

In accordance with a preferred embodiment of the present invention, said organic electron acceptor compound can be selected, for example, from fullerene derivatives, such as [6,6]-phenyl-C$_{61}$-butyric acid methyl ester (PCBM), [6,6]-phenyl-C$_{71}$-butyric acid methyl ester (PC71BM), bis-adduct indene-C$_{60}$ (ICBA), bis(1-[3-(methoxycarbonyl)propyl]-1-phenyl)-[6,6]C62 (Bis-PCBM). [6,6]-phenyl-C$_{61}$-butyric acid methyl ester (PCBM), [6,6]-phenyl-C$_{71}$-butyric acid methyl ester (PC71BM), are preferred.

In accordance with a further preferred embodiment of the present invention, said organic electron acceptor compound can be selected, for example, from non-fullerene, optionally polymeric, compounds such as, for example, compounds based on perylene-diimides or naphthalene-diimides and fused aromatic rings; indacenothiophene with terminal electron-poor groups; compounds having an aromatic core able to symmetrically rotate, for example, derivatives of corannulene or truxenone. 3,9-bis{2-methylene-[3-(1,1-dicyanomethylene)-indanone]}-5,5,11,11-tetrakis(4-hexylphenyl)-dithieno[2,3-d:2',3'-d']-s-indaceno[1,2-b:5,6-b']-dithiophene; poly {[N,N'-bis (2-octyldodecyl)-1,4,5,8-naftalenediimide-2,6-diyl]-alt-5,5'-(2,2'-bithiophene)}, are preferred.

More details on said non-fullerene compounds can be found, for example, in Nielsen C. B. et al., "*Accounts of Chemical Research*" (2015), Vol. 48, pag. 2803-2812; Zhan C. et al., "*RSC Advances*" (2015), Vol. 5, pag. 93002-93026.

Said active layer can be obtained by depositing on said cathode buffer layer a solution containing at least one photoactive organic polymer and at least one organic electron acceptor compound, selected from those mentioned above, by using appropriate deposition techniques such as, for example, spin-coating, spray-coating, ink-jet printing, slot die coating, gravure printing, screen printing.

In accordance with a preferred embodiment of the present invention, said cathode buffer layer may comprise zinc oxide, titanium oxide, preferably zinc oxide.

Said cathode buffer layer can be obtained by depositing a zinc oxide precursor solution on said cathode through deposition techniques known in the state of the art such as, for example, vacuum evaporation, spin coating, drop casting, doctor blade casting, slot die coating, gravure printing, flexographic printing, knife-over-edge-coating, spray-coating, screen-printing.

More details on the formation of said cathode buffer layer based on a zinc oxide precursor solution can be found, for example, in Pò R. et al., "*Energy & Environmental Science*" (2014), Vol. 7, pag. 925-943.

In accordance with a preferred embodiment of the present invention, said cathode may be made of a material selected, for example, from: indium tin oxide (ITO), tin oxide doped with fluorine (FTO), zinc oxide doped with aluminum (AZO), zinc oxide doped with gadolinium oxide (GZO); or it may be constituted by grids of conductive material, said conductive material being preferably selected, for example, from silver (Ag), copper (Cu), graphite, graphene, and by a transparent conductive polymer, said transparent conductive polymer preferably being selected, for example, from PEDOT:PSS [poly(3,4-ethylenedioxythiophene):polystyrene sulfonate], polyaniline (PANI); or it may be constituted by a metal nanowire-based ink, said metal preferably being selected, for example, from silver (Ag), copper (Cu).

Said cathode can be obtained by techniques known in the state of the art such as, for example, electron beam assisted deposition, sputtering. Alternatively, said cathode can be obtained through deposition of said transparent conductive polymer via spin coating, or gravure printing, or flexographic printing, or slot die coating, preceded by deposition of said grids of conductive material via evaporation, or screen-printing, or spray-coating, or flexographic printing. Alternatively, said cathode can be obtained through deposition of said metal nanowire-based ink through spin coating, or gravure printing, or flexographic printing, or slot die coating. The deposition can take place on the support layer selected from those listed below.

In accordance with a preferred embodiment of the present invention, said cathode may be associated with a support layer that may be made of a rigid transparent material such as, for example, glass, or flexible material such as, for example, polyethylene terephthalate (PET), polyethylene naphthalate (PEN), polyethyleneimine (PI), polycarbonate (PC), polypropylene (PP), polyimide (PI), triacetyl cellulose (TAC), or their copolymers.

In accordance with a preferred embodiment of the present invention, said at least one heteropoly acid can be selected, for example, from heteropoly acids having general formula (I):

in which:
A represents a silicon atom, or a phosphorus atom;
M represents an atom of a transition metal belonging to group 5 or 6 of the Periodic Table of the Elements, preferably selected from molybdenum, tungsten;
x is an integer that depends on the valence of A; preferably it is 3 or 4;
y is 12 or 18;
z is 4 or 6.

In accordance with a further preferred embodiment of the present invention, said at least one heteropoly acid can be selected, for example, from heteropoly acids having general formula (II):

in which:
A represents a silicon atom, or a phosphorus atom;
x is an integer that depends on the valence of A; preferably it is 3 or 4;
p is 6 or 10;
q is 2 or 6.

For the purpose of the present invention, said heteropoly acids having general formula (I) and said heteropoly acids having general formula (II) can be used in hydrated form, or in alcoholic solution for example, in ethanol, iso-propanol, or mixtures thereof).

In accordance with a preferred embodiment of the present invention, said heteropoly acids having general formula (I) and said heteropoly acids having general formula (II) can be selected, for example, from: phosphomolybdic acid hydrate $\{H_3[P(MoO_3)_{12}O_4].nH_2O\}$, phosphomolybdic acid $\{H_3[P(MoO_3)_{12}O_4]\}$ in alcoholic solution, phosphotungstic acid hydrate $\{H_3[P(WO_3)_{12}O_4].nH_2O\}$, phosphotungstic acid in alcoholic solution $\{H_3[P(WO_3)_{12}O_4]\}$, silicomolybdic acid hydrate $\{H_4[Si(MoO_3)_{12}O_4].nH_2O\}$, silicomolybdic acid $\{H_4[Si(MoO_3)_{12}O_4]\}$ in alcoholic solution, silicotungstic acid hydrate $\{H_4[Si(WO_3)_{12}O_4].nH_2O\}$, silicotungstic acid $\{H_4[Si(WO_3)_{12}O_4]\}$ in alcoholic solution, phosphomolybdic vanadic acid hydrate $\{H_3[P(Mo)_6(V)_6O_{40}].nH_2O\}$, phosphomolybdic vanadic acid $\{H_3[P(Mo)_6(V)_6O_{40}]\}$ in alcoholic solution, phosphomolybdic vanadic acid hydrate $\{H_3[P(Mo)_{10}(V)_2O_{40}].nH_2O\}$, phosphomolybdic vanadic acid $\{H_3[P(Mo)_{10}(V)_2O_{40}]\}$ in alcoholic solution, or mixtures thereof. Phosphomolybdic acid hydrate $\{H_3[P(MoO_3)_{12}O_4].nH_2O\}$, phosphomolybdic acid $\{H_3[P(MoO_3)_{12}O_4]\}$ in alcoholic solution, silicotungstic acid hydrate $\{H_4[Si(WO_3)_{12}O_4].nH_2O\}$, are preferred.

Heteropoly acids having general formula (I) or (II) are commercially available.

In accordance with a preferred embodiment of the present invention, said at least one salt or complex of a transition metal belonging to group 5 or 6 of the Periodic Table of the Elements with an organic anion or with an organic ligand can be selected, for example, from: bis(acetylacetonato) dioxomolybdenum (VI) (Cas No. 17524-05-9), molybdenum(VI) dioxide bis(2,2,6,6-tetramethyl-3,5-heptanedionate (Cas No. 34872-98-5), bis(tert-butylimido)(bis)(dimethylamido)molybdenum (VI) (Cas No. 923956-62-1), 2,6-di-iso-propylphenyl imido-neophilidene molybdenum (VI) bis (tert-butoxide) (Cas No. 126949-65-3), 2,6-di-iso-propylphenylimidoneophilidene molybdenum (VI) bis (hexafluoro-tert-butoxide) ("Schrock's catalyst") (Cas No. 139220-25-0), adduct of 2,6-di-iso-propylphenylimidoneo-phylidene-molybdenum (VI)bis (trifluoro-methanesulfonate) dimethoxyethane (Cas No. 126949-63-1), 2,6-di-iso-propylphenylimidoneophylidene-[racemic-BIPHEN] molybdenum (VI) ("rac-Schrock's-Hoveyda catalyst") (Cas No. 300344-02-9), 2,6-di-iso-propylphenylimidoneo-phylidene[R-(+)-BIPHEN]molybdenum (VI) ["(R) Schrock's-Hoveyda catalyst"] (Cas No. 329735-77-5), 2,6-di-iso-propylphenylimidoneophylidene [S-(−)BIPHEN] molybdenum (VI) ["(S) Schrock's-Hoveyda catalyst"] (Cas No. 205815-80-1), vanadium(V) oxytriisopropoxide (Cas No. 5588-84-1), bis (acetylacetonate) oxovanadium (IV) (Cas No. 3153-26-2), acetylacetonate of vanadium (III), tetrakis(dimethylamino)vanadium (IV) (Cas No. 19824-56-7), tetrakis (diethylamino)vanadium (IV) (Cas No. 219852-96-7), or mixtures thereof. Molybdenum(VI) dioxide bis (acetylacetonate) (Cas No. 17524-05-9), vanadium(V) oxytriisopropoxide (Cas No. 5588-84-1), bis (acetylacetonate) oxovanadium (IV) (Cas No. 3153-26-2), are preferred.

Salts of a transition metal belonging to group 5 or 6 of the Periodic Table of the Elements, with an organic anion, or with an organic ligand, are available commercially.

In accordance with a preferred embodiment of the present invention, said alcohols can be selected, for example, from:

methanol, ethanol, trifluoroethanol, n-propanol, iso-propanol, hexafluoro-iso-propanol, n-butanol, or mixtures thereof. iso-propanol, n-butanol, are preferred.

In accordance with a preferred embodiment of the present invention, said ketones can be selected, for example, from cyclohexanone, acetone, methyl ethyl ketone, or mixtures thereof.

In accordance with a preferred embodiment of the present invention, said esters can be selected, for example, from butyrolactone, ethyl acetate, propyl acetate, butyl acetate, ethyl butyrate, or mixtures thereof.

In accordance with a preferred embodiment of the present invention, said process can be carried out at a temperature ranging from 25° C. to the boiling point of the solvent used, and for a time ranging from 15 minutes to 8 hours, preferably ranging from 30 minutes to 5 hours.

It is to be noted that at the end of the process according to the present invention a hole transporting material is obtained in solution form, said solution having a pH ranging from 6 to 7.

Said second anode buffer layer can be obtained by depositing the hole transporting material in solution form obtained at the end of the aforementioned process onto the active layer through deposition techniques known in the state of the art such as, for example, vacuum evaporation, spin coating, drop casting, doctor blade casting, spin-coating, slot die coating, gravure printing, flexographic printing, knife-over-edge-coating, spray-coating, screen-printing, adjusting on a case-by-case basis the rheological parameters of said hole transporting material in solution form (for example, viscosity) based on the requirements of the deposition technique used.

As mentioned above, the anode, the cathode, the first anode buffer layer and the cathode buffer layer present in the aforementioned polymer photovoltaic cell (or solar cell) with an inverted structure, can be deposited through techniques known in the state of the art.

More details on said techniques can be found, for example, in: Pò R. et al., "*Interfacial Layers*, in "*Organic Solar Cells—Fundamentals, Devices, and Upscaling*" (2014), Chapter 4, Richter H. and R and B. Eds., Pan Stanford Publishing Pte Ltd.; Yoo S. et al., "*Electrodes in Organic Photovoltaic Cells*, in "*Organic Solar Cells—Fundamentals, Devices, and Upscaling*" (2014), Chapter 5, Richter H. and Rand B. Eds., Pan Stanford Publishing. Pte Ltd.; Angmo D. et al., "*Journal of Applied Polymer Science*" (2013), Vol. 129, Issue 1, pag. 1-14.

As mentioned above, the present invention also relates to a process for preparing the aforesaid polymer photovoltaic cell (or solar cell) with an inverted structure.

In accordance with a preferred embodiment of the present invention, the process for preparing the polymer photovoltaic cell (or solar cell) with an inverted structure comprises:

forming the cathode by sputtering; or via electron beam assisted deposition; or through deposition of a conductive transparent polymer via spin coating, or gravure printing, or flexographic printing, or slot die coating, preceded by the deposition of grids of conductive material by evaporation, or screen-printing, or spray-coating, or flexographic printing; or by deposition of a metal nanowire-based ink via spin coating, or gravure printing, or flexographic printing, or slot die coating;

forming the cathode buffer layer by spin coating, or gravure printing, or flexographic printing, or slot die above said cathode;

forming the active layer via spin coating, or gravure printing, or slot-die, above said cathode buffer layer;

forming the second anode buffer layer by spin coating, or gravure printing, or screen-printing, or flexographic printing, or slot-die above said active layer; forming the first anode buffer layer by spin coating, or gravure printing, or screen-printing, or flexographic printing, or slot-die, above said second anode buffer layer;

forming the anode by vacuum evaporation, or screen-printing, or spray-coating, or flexographic printing, above said first anode buffer layer; or by deposition of a conductive transparent polymer via spin coating, or gravure printing, or flexographic printing, or slot die coating, followed by deposition of grids of conductive material by evaporation, or screen-printing, or spray-coating, or flexographic printing, above said first anode buffer layer; or by deposition of a metal nanowire-based ink via spin coating, or gravure printing, or flexographic printing, or slot die coating, above said first anode buffer layer.

In accordance with a preferred embodiment of the present invention, in the polymer photovoltaic cell (or solar cell) with an inverted structure according to the present invention:

the anode may have a thickness ranging from 50 nm to 150 nm, preferably ranging from 80 nm to 120 nm;

the first anode buffer layer may have a thickness ranging from 10 nm to 2000 nm, preferably ranging from 15 nm to 1000 nm;

the second anode buffer layer may have a thickness ranging from 1 nm to 100 nm, preferably ranging from 2 nm to 40 nm;

the active layer may have a thickness ranging from 50 nm to 500 nm, preferably ranging from 70 nm to 360 nm;

the cathode buffer layer may have a thickness ranging from 10 nm to 100 nm, preferably ranging from 20 nm to 50 nm;

the cathode may have a thickness ranging from 50 nm to 150 nm, preferably ranging from 80 nm to 100 nm.

The present invention will now be illustrated in more detail through an embodiment with reference to FIG. 1 provided below which represents a cross sectional view of a polymer photovoltaic cell (or solar cell) with an inverted structure according to the present invention.

With reference to FIG. 1, the polymer photovoltaic cell (or solar cell) with an inverted structure (1) comprises:

a transparent support (7), for example a glass or plastic support;

a cathode (2), for example an indium tin oxide (ITO) cathode; or a cathode obtained through deposition of a conductive transparent polymer by spin coating, or gravure printing, or flexographic printing, or slot die coating, preceded by deposition of grids of conductive material by evaporation, or screen-printing, or spray-coating, or flexographic printing; or a cathode obtained by deposition of metal nanowire-based ink via spin coating, or gravure printing, or flexographic printing, or slot die coating;

a cathode buffer layer (3), comprising, for example, zinc oxide;

a layer of photoactive material (4) comprising at least one photoactive organic polymer, for example, PTB7 {poly({4,8-bis[(2-ethylhexyl)oxy]-benzo[1,2-b:4,5-b']dithiophene-2,6-diyl}-{3-fluoro-2-[(2-ethylexyl)-carbonyl]-thieno[3,4-b]thiophenediyl})} and at least one non-functionalized fullerene, for example, methyl ester of [6,6]-phenyl-$C_{71}$-butyric acid ($PC_{71}BM$);

a second anode buffer layer (5b), comprising the hole transporting material obtained as described above, for example molybdenyl phosphomolybdate, vanadyl phosphomolybdate, vanadyl silicotungstate;

a first anode buffer layer (5a), comprising, for example, PEDOT:PSS [poly(3,4-ethylenedioxythiophene):polystyrene sulfonate];

an anode (6), for example a silver (Ag) anode, or an anode obtained through deposition of a conductive transparent polymer by spin coating, or gravure printing, or flexographic printing, or slot die coating, followed by deposition of grids of conductive material by evaporation, or screen-printing, or spray-coating, or flexographic printing; or an anode obtained by deposition of metal nanowire-based ink via spin coating, or gravure printing, or flexographic printing, or slot die coating.

For the purpose of understanding the present invention better and to put it into practice, below are some illustrative and non-limiting examples thereof.

EXAMPLE 1

Preparation of Vanadyl Phosphomolybdate in Iso-Propanol 211 mg of bis (acetylacetonato) oxovanadium (IV) (Cas No. 3153-26-2) (Strem Chemicals) (0.797 mmoles) dissolved in 20 ml of iso-propanol (Aldrich) were placed in a 250 ml flask and, subsequently 4.845 g of a 20% by weight solution of phosphomolybdic acid in ethanol (Aldrich) (0.531 mmoles) and 65 ml of iso-propanol (Aldrich) were added: the mixture obtained was heated to 65° C., for 2.5 hours, gradually obtaining a dark blue-green solution which, after 24 hours, gradually turns pale yellow. The solution obtained was cooled to ambient temperature (25° C.) and transferred into a glass vessel with a plug: one drop of said solution was placed on a strip of wet litmus paper to measure the pH, which was equal to about 6-7.

EXAMPLE 2

Preparation of Vanadyl Silicotungstate in Iso-Propanol 1.14 g of silicotungstic acid hydrate (Fluka) (0.359 mmoles) dissolved in 20 ml of iso-propanol (Aldrich) were placed in a 250 ml flask and subsequently, 116 g of vanadium(V) oxytriisopropoxide (Cas No. 5588-84-1) (Aldrich) (0.475 mmoles) dissolved in 60 ml of iso-propanol (Aldrich) were added: the mixture obtained was heated to 70° C., for 3 hours, obtaining a colorless solution. The solution obtained was cooled to ambient temperature (25° C.) and transferred into a glass vessel with a plug: one drop of said solution was placed on a strip of wet litmus paper to measure the pH, which was equal to about 6-7.

EXAMPLE 3

Preparation of Molybdenyl Phosphomolybdate in Iso-Propanol 260 mg of molybdenum(VI) dioxide bis(acetylacetonate) (Cas No. 17524-05-9) (Strem Chemicals) (0.797 mmoles) dissolved in 50 ml of iso-propanol (Aldrich) were placed in a 250 ml flask: the suspension thus obtained was heated to 80° C. Subsequently, 998 mg of phosphomolybdic acid trihydrate (Aldrich) (0.531 mmoles) dissolved in 50 ml of iso-propanol (Aldrich) were added: the mixture thus obtained was kept at 80° C., for 3 hours, obtaining a very intense emerald green solution. The solution obtained was cooled to ambient temperature (25° C.) and transferred into a glass vessel with a plug: one drop of said solution was placed on a strip of wet litmus paper to measure the pH, which was equal to about 6-7.

EXAMPLE 4 (INVENTION)

Solar Cell with PTB7:$PC_{71}BM$, Vanadyl Phosphomolybdate and PEDOT:PSS A polymer-based device was prepared on a glass substrate coated with ITO (indium tin oxide) (Kintec Company—Hong Kong), previously subjected to a cleaning process consisting of manual cleaning, rubbing with a lint-free cloth soaked in a detergent diluted with distilled water. The substrate was then rinsed with distilled water. Subsequently, the substrate was cleaned thoroughly through the following methods in sequence: ultrasonic baths in (i) distilled water plus detergent (followed by manual drying with a lint-free cloth); (ii) distilled water [followed by manual drying with a lint-free cloth]; (iii) acetone (Aldrich) and (iv) iso-propanol (Aldrich) in sequence. In particular, the substrate was placed in a beaker containing the solvent, placed in an ultrasonic bath at 40° C., for a 10 minute treatment. After treatments (iii) and (iv), the substrate was dried with a compressed nitrogen stream.

Subsequently, the glass/ITO was cleaned further in an air-plasma device (Tucano type—Gambetti), straight before proceeding to the next step.

The substrate thus treated was ready for the deposition of the cathode buffer layer. For that purpose, the zinc oxide buffer layer was obtained starting from a 0.162 M solution of the complex [$Zn^{2+}$]-ethanolamine (Aldrich) in butanol (Aldrich). The solution was deposited through rotation on the substrate, operating at a rotation speed equal to 600 rpm (acceleration equal to 300 rpm/s), for 2 minutes and 30 seconds, and subsequently at a rotation speed equal to 1500 rpm, for 5 seconds. Immediately after the deposition of the cathode buffer layer, the formation of zinc oxide was obtained by thermally treating the device at 140° C., for 5 minutes, on a hot plate in ambient air. The cathode buffer layer thus obtained had a thickness of 30 nm: subsequently, said cathode buffer layer was partially removed from the surface with 0.1 M acetic acid (Aldrich), leaving the layer only on the desired portion of the substrate.

A solution of PTB7 {poly({4,8-bis[(2-ethylhexyl)-oxy]benzo[1,2-b:4,5-b']dithiophene-2,6-diyl}-{3-fluoro-2-[(2-ethylhexyl)-carbonyl]-thieno[3,4-b]thiophenediyl})} (Aldrich) and [6,6]-phenyl-$C_{71}$-butyric acid methyl ester ($PC_{71}$13 M) (Aldrich), 1:1.5 (w:w) in chlorobenzene was prepared with a concentration of PTB7 equal to 10 mg/ml: said solution was left, under agitation, at 45° C., all night. Subsequently, the solution was left to cool to ambient temperature (25° C.) and 1,8-diiodooctane was added (3% by weight with respect to the total weight of the solution): everything was left, under agitation, at ambient temperature (25° C.), for 90 minutes, at the end of which the solution was left to rest, at ambient temperature (25° C.), for 30 minutes. The active layer was deposited, starting from the solution thus obtained, through spin coating, operating at a rotation speed equal to 2000 rpm (acceleration equal to 1000 rmp/s) for 2 minutes. The thickness of the active layer was 90 nm. At the end of the deposition, everything was kept under vacuum (about $10^{-2}$ bar), for about 20 minutes.

The second anode buffer layer was deposited onto the active layer thus obtained, which was obtained starting from the vanadyl phosphomolybdate solution in iso-propanol obtained as described in Example 1, diluted 1:1 in iso-propanol, operating at a rotation speed of 5000 rpm (acceleration equal to 2500 rpm/s), for 30 seconds. The thickness of the second anode buffer layer was 15 nm: subsequently, said second anode buffer layer was partially removed from the surface with 0.1 M acetic acid (Aldrich), leaving the layer only on the desired portion of the substrate.

The first anode buffer layer was deposited onto said second anode buffer layer, through spin coating starting from a suspension comprising PEDOT:PSS [poly(3,4-ethylenedioxythiophene):polystyrene sulfonate] (Clevios™ HTL Solar—Heraeus Co.) with a concentration of PEDOT:PSS equal to 1.2 mg/ml, operating at a rotation speed of 5000 rpm (acceleration equal to 2500 rpm/s), for 90 seconds: straight after the deposition of the anode buffer layer, the device was treated at 120° C., for 3 minutes, on a hot plate in ambient air. The thickness of the first anode buffer layer was 20 nm: subsequently, said first anode buffer layer was partially removed from the surface with 0.1 M acetic acid (Aldrich), leaving the layer only on the desired portion of the substrate.

The silver (Ag) anode was deposited onto said first anode buffer layer, the anode having a thickness of 100 nm, through vacuum evaporation, appropriately masking the area of the device so as to obtain an active area of 0.25 mm$^2$.

The deposition of the anode was performed in a standard vacuum evaporation chamber containing the substrate and an evaporation vessel equipped with a heating element containing 10 shots of silver (Ag) (diameter 1 mm-3 mm) (Aldrich). The evaporation process was performed under vacuum, at a pressure of about $1\times10^{-6}$ bar. After evaporation, the silver (Ag) was condensed in the non-masked parts of the device.

The thicknesses were measured with a Dektak 150 profilometer (Veeco Instruments Inc.).

The electrical characterization of the device obtained was performed in a (nitrogen) controlled atmosphere in a glove box at ambient temperature (25° C.). The current-voltage curves (I-V) were acquired with a Keithley® 2600A multimeter connected to a PC for data collection. The photocurrent was measured by exposing the device to the light of an ABET SUN® 2000-4 solar simulator, able to provide AM 1.5G radiation with an intensity of 90 mW/cm$^2$ (0.9 suns), measured with an Ophir Nova® II powermeter connected to a 3A-P thermal sensor. Table 1 shows the characteristic parameters as mean values.

EXAMPLE 5 (INVENTION)

Solar Cell with PTB7:PC$_{71}$BM, Molybdenyl Phosphomolybdate and PEDOT:PSS

A polymer-based device was prepared on a glass substrate coated with ITO (indium tin oxide) (Kintec Company—Hong Kong), previously subjected to a cleaning process operating as described in Example 4.

The deposition of the cathode buffer layer, the deposition of the active layer and the deposition of the first anode buffer layer were performed as described in Example 4; the composition of said cathode buffer layer, the composition of said active layer and the composition of said first anode buffer layer are the same as those reported in Example 4; the thickness of said cathode buffer layer, the thickness of said active layer and the thickness of said first anode buffer layer are the same as those reported in Example 4. The second anode buffer layer was deposited onto the active layer obtained, through spin coating starting from the molybdenyl phosphomolybdate solution in iso-propanol obtained as described in Example 3, diluted in iso-propanol, operating at a rotation speed of 5000 rpm (acceleration equal to 2500 rpm/s), for 30 seconds. The thickness of the second anode buffer layer was 15 nm: subsequently, said second anode buffer layer was partially removed from the surface with 0.1 M acetic acid (Aldrich), leaving the layer only on the desired portion of the substrate.

The deposition of the silver (Ag) anode was performed as described in Example 4:the thickness of said silver anode is the same as that reported in Example 4.

The thicknesses were measured with a Dektak 150 profilometer (Veeco Instruments Inc.). The electrical characterization of the device, the current-voltage curves (I-V) and the photocurrent, were measured as described in Example 4. Table 1 shows the characteristic parameters as mean values.

EXAMPLE 6 (COMPARATIVE)

Solar Cell with PTB7:PC$_{71}$BM and Molybdenum Oxide (MoO$_3$)

A polymer-based device was prepared on a glass substrate coated with ITO (indium tin oxide) (Kintec Company—Hong Kong), previously subjected to a cleaning process operating as described in Example 4.

The deposition of the cathode buffer layer and the deposition of the active layer were performed as described in Example 4; the composition of said cathode buffer layer and the composition of said active layer are the same as those reported in Example 4; the thickness of said cathode buffer layer and the thickness of said active layer are the same as those reported in Example 4.

The anode buffer layer was deposited onto the active layer obtained, the buffer layer being obtained by depositing molybdenum oxide (MoO$_3$) (Aldrich) through a thermal process: the thickness of the anode buffer layer was 10 nm. The silver (Ag) anode was deposited onto the anode buffer layer, the anode having a thickness of 100 nm, through vacuum evaporation, appropriately masking the area of the device so as to obtain an active area of 0.25 mm$^2$.

The depositions of the anode buffer layer and the anode were performed in a standard vacuum evaporation chamber containing the substrate and two evaporation vessels equipped with a heating element containing 10 mg of molybdenum oxide (MoO$_3$) in powder and 10 shots of silver (Ag) (diameter 1 mm-3 mm) (Aldrich), respectively. The evaporation process was performed under vacuum, at a pressure of about $1\times10^{-6}$ bar. The molybdenum oxide (MoO$_3$) and silver (Ag), after evaporation, were condensed in the non-masked parts of the device.

The thicknesses were measured with a Dektak 150 profilometer (Veeco Instruments Inc.). The electrical characterization of the device, the current-voltage curves (I-V) and the photocurrent, were measured as described in Example 4. Table 1 shows the characteristic parameters as mean values.

EXAMPLE 7 (COMPARATIVE)

Solar Cell with PTB7:PC$_{71}$BM and PEDOT:PSS

A polymer-based device was prepared on a glass substrate coated with ITO (indium tin oxide) (Kintec Company—Hong Kong), previously subjected to a cleaning process operating as described in Example 4.

The deposition of the cathode buffer layer, the deposition of the active layer and the deposition of the first anode buffer layer were performed as described in Example 4, the composition of said cathode buffer layer, the composition of said active layer and the composition of said first anode buffer layer are the same as those reported in Example 4; the thickness of said cathode buffer layer, the thickness of said active layer and the thickness of said first anode buffer layer are the same as those reported in Example 4. The deposition of the silver (Ag) anode was performed as described in Example 4: the thickness of said silver anode is the same as that reported in Example 4.

The deposition of the second anode buffer layer between the active layer and the silver (Ag) anode was not performed.

The thicknesses were measured with a Dektak 150 profilometer (Veeco Instruments Inc.). The electrical characterization of the device, the current-voltage curves (I-V) and the photocurrent, were measured as described in Example 4. Table 1 shows the characteristic parameters as mean values.

EXAMPLE 8 (COMPARATIVE)

Solar Cell with PTB7:$PC_{71}BM$ and Vanadyl Phosphomolybdate

A polymer-based device was prepared on a glass substrate coated with ITO (indium tin oxide) (Kintec Company—Hong Kong), previously subjected to a cleaning process operating as described in Example 4.

The deposition of the cathode buffer layer, the deposition of the active layer and the deposition of the second anode buffer layer were performed as described in Example 4; the composition of said cathode buffer layer, the composition of said active layer and the composition of said second anode buffer layer are the same as those reported in Example 4; the thickness of said cathode buffer layer, the thickness of said active layer and the thickness of said second anode buffer layer are the same as those reported in Example 4. The deposition of the silver (Ag) anode was performed as described in Example 4: the thickness of said silver anode is the same as that reported in Example 4.

The deposition of the first anode buffer layer between the second anode buffer layer and the silver (Ag) anode was not performed.

The thicknesses were measured with a Dektak 150 profilometer (Veeco Instruments Inc.). The electrical characterization of the device, the current-voltage curves (I-V) and the photocurrent, were measured as described in Example 4. Table 1 shows the characteristic parameters as mean values.

EXAMPLE 9 (COMPARATIVE)

Solar Cell with PTB7:$PC_{71}BM$ and Mixture of Vanadyl Phosphomolybdate/PEDOT:PSS A polymer-based device was prepared on a glass substrate coated with ITO (indium tin oxide) (Kintec Company—Hong Kong), previously subjected to a cleaning process operating as described in Example 4.

The deposition of the cathode buffer layer and the deposition of the active layer were performed as described in Example 4; the composition of said cathode buffer layer and the composition of said active layer are the same as those reported in Example 4; the thickness of said cathode buffer layer and the thickness of said active layer are the same as those reported in Example 4.

An anode buffer layer was deposited onto the active layer obtained through spin coating starting from the solution obtained by mixing, at ambient temperature (25° C.), for 120 minutes, 0.8 ml of a suspension comprising PEDOT:PSS [poly(3,4-ethylenedioxythiophene):polystyrene sulfonate] (Clevios™ HTL Solar—Heraeus Co.) with a PEDOT:PSS concentration of 1.2 mg/ml, 0.1 ml of iso-propanol, and 0.1 ml of the solution of vanadyl phosphomolybdate in iso-propanol obtained as described in Example 1, operating at a rotation speed of 5000 rpm (acceleration equal to 2500 rpm/s), for 30 seconds: straight after the deposition of the anode buffer layer, the device was treated at 120° C., for 3 minutes, on a hot plate in ambient air. The thickness of the anode buffer layer was 15 nm: subsequently, said anode buffer layer was partially removed from the surface with 0.1 M acetic acid (Aldrich), leaving the layer only on the desired portion of the substrate.

The deposition of the silver (Ag) anode was performed as described in Example 4: the thickness of said silver anode is the same as that reported in Example 4.

The thicknesses were measured with a Dektak 150 profilometer (Veeco Instruments Inc.). The electrical characterization of the device, the current-voltage curves (I-V) and the photocurrent, were measured as described in Example 4. Table 1 shows the characteristic parameters as mean values.

EXAMPLE 10 (COMPARATIVE)

Solar Cell with PTB7:$PC_{71}BM$, Vanadium(V) Oxytriisopropoxide and PEDOT:PSSS

A polymer-based device was prepared on a glass substrate coated with ITO (indium tin oxide) (Kintec Company—Hong Kong), previously subjected to a cleaning process operating as described in Example 4.

The deposition of the cathode buffer layer, the deposition of the active layer and the deposition of the first anode buffer layer were performed as described in Example 4; the composition of said cathode buffer layer, the composition of said active layer and the composition of said first anode buffer layer are the same as those reported in Example 4; the thickness of said cathode buffer layer, the thickness of said active layer and the thickness of said first anode buffer layer are the same as those reported in Example 4. The second anode buffer layer was deposited onto the active layer obtained, the buffer layer being obtained through spin coating starting from a solution of vanadium(V) oxytriisopropoxide (Cas No. 5588-84-1) (Strem) in iso-propanol (Aldrich) at a concentration of 6.9 mg/ml, operating at a rotation speed of 5000 rpm (acceleration equal to 2500 rpm/s), for 30 seconds: straight after the deposition of the second anode buffer layer, the device was treated at 120° C., for 1 minute, on a hot plate in ambient air. The thickness of the second anode buffer layer was 15 nm: subsequently, said second anode buffer layer was partially removed from the surface with 0.1 M acetic acid (Aldrich), leaving the layer only on the desired portion of the substrate.

The deposition of the silver (Ag) anode was performed as described in Example 4: the thickness of said silver anode is the same as that reported in Example 4.

The thicknesses were measured with a Dektak 150 profilometer (Veeco Instruments Inc.). The electrical characterization of the device, the current-voltage curves (I-V) and the photocurrent, were measured as described in Example 4. Table 1 shows the characteristic parameters as mean values.

TABLE 1

| Example | $FF^{(1)}$ | $Voc^{(2)}$ (mV) | $Jsc^{(3)}$ (mA/cm$^2$) | $\eta^{(4)}$ (%) |
|---|---|---|---|---|
| 4 (invention) | 0.59 | 0.77 | 11.09 | 5.05 |
| (after 1 month) | 0.59 | 0.76 | 10.78 | 4.84 |
| 5 (invention) | 0.61 | 0.77 | 12.21 | 5.71 |
| (after 1 month) | 0.61 | 0.76 | 11.76 | 5.48 |
| 6 (comparative) | 0.62 | 0.73 | 11.33 | 5.09 |
| 7 (comparative) | 0.46 | 0.73 | 11.85 | 3.99 |
| 8 (comparative) | 0.47 | 0.66 | 11.65 | 3.68 |

TABLE 1-continued

| Example | FF[1] | Voc[2] (mV) | Jsc[3] (mA/cm²) | η[4] (%) |
|---|---|---|---|---|
| 9 (comparative) | 0.40 | 0.34 | 9.34 | 1.27 |
| 10 (comparative) | 0.50 | 0.62 | 3.77 | 1.16 |

[1]fill factor;
[2]open circuit voltage;
[3]short-circuit photocurrent density;
[4]photoelectric conversion efficiency.

From the data reported in Table 1 it can be deduced that:
the solar cell having a first anode buffer layer comprising PEDOT:PSS and a second anode buffer layer comprising vanadyl phosphomolybdate in accordance with the present invention [Example 4 (invention)], has comparable, if not higher, performance levels, in particular in terms of photoelectric conversion efficiency (η), which remain stable 1 month after the solar cell has been manufactured, both with respect to those of solar cells having a single anode buffer layer comprising molybdenum oxide (MoO₃) [Example 6 (comparative)] or PEDOT:PSS [Example 7 (comparative)] or vanadyl phosphomolybdate [Example 8 (comparative)] or a mixture of PEDOT:PSS and vanadyl phosphomolybdate [Example 9 (comparative)], and with respect to those of a solar cell having a first anode buffer layer comprising PEDOT:PSS and a second anode buffer layer comprising vanadium(V) oxytriisopropoxide [Example 10 (comparative)];

the solar cell having a first anode buffer layer comprising PEDOT:PSS and a second anode buffer layer comprising molybdenyl phosphomolybdate in accordance with the present invention [Example 5 (invention)], has higher performance levels, in particular in terms of photoelectric conversion efficiency (η), which remain stable 1 month after the solar cell has been manufactured, both with respect to those of solar cells having a single anode buffer layer comprising molybdenum oxide (MoO₃) [Example 6 (comparative)] or PEDOT:PSS [Example 7 (comparative)] and with respect to those of a solar cell having a first anode buffer layer comprising PEDOT:PSS and a second anode buffer layer comprising vanadium(V) oxytriisopropoxide [Example 10 (comparative)].

The invention claimed is:

1. Polymer photovoltaic cell (or solar cell) with an inverted structure comprising:
an anode;
a first anode buffer layer;
an active layer comprising at least one photoactive organic polymer as the electron donor and at least one organic electron acceptor compound;
a cathode buffer layer;
a cathode;
wherein between said first anode buffer layer and said active layer a second anode buffer layer is placed comprising a hole transporting material, said hole transporting material being obtained through a process comprising:
reacting at least one heteropoly acid containing at least one transition metal belonging to group 5 or 6 of the Periodic Table of the Elements; with
an equivalent amount of at least a salt or a complex of a transition metal belonging to group 5 or 6 of the Periodic Table of the Elements with an organic anion, or with an organic ligand;
in the presence of at least one organic solvent selected from alcohols, ketones, esters.

2. Polymer photovoltaic cell (or solar cell) with an inverted structure according to claim 1, wherein said anode is made of metal, or it is constituted by grids of conductive material, and by a transparent conductive polymer or it is constituted by a metal nanowire-based ink.

3. Polymer photovoltaic cell (or solar cell) with an inverted structure according to claim 1, wherein said first anode buffer layer is selected from PEDOT:PSS [poly(3,4-ethylenedioxythiophene):polystyrene sulfonate, and polyaniline (PANI)].

4. Polymer photovoltaic cell (or solar cell) with an inverted structure according to claim 1, wherein said photoactive organic polymer is selected from:
(a) polythiophenes;
(b) conjugated statistical or alternating copolymers comprising:
at least one benzotriazole unit (B) having the general formula (Ia) or (Ib):

(Ia)

(Ib)

in which the group R is selected from alkyl groups, aryl groups, acyl groups, thioacyl groups, said alkyl, aryl, acyl and thioacyl groups being optionally substituted;
at least one conjugated structural unit (A), in which each unit (B) is connected to at least one unit (A) in any of positions 4, 5, 6, or 7;
(c) conjugated alternating copolymers comprising benzothiadiazole units;
(d) conjugated alternating copolymers comprising thieno [3,4-b] pyrazidine units;
(e) conjugated alternating copolymers comprising quinoxaline units;
(f) conjugated alternating copolymers comprising monomeric silica units;
(g) conjugated alternating copolymers comprising condensed thiophene units;
(h) conjugated alternating copolymers comprising benzothiodiazole or naphtathiadiazole units, or conjugated alternating copolymers substituted with at least one fluorine atom, and thiophene units substituted with at least one fluorine atom;
(i) conjugated copolymers comprising thieno [3,4-c]pyrrole-4,6-dione units;
(l) conjugated copolymers comprising thienothiophene units;
(m) polymers comprising a derivative of indacen-4-one having general formula (III), (IV) or (V):

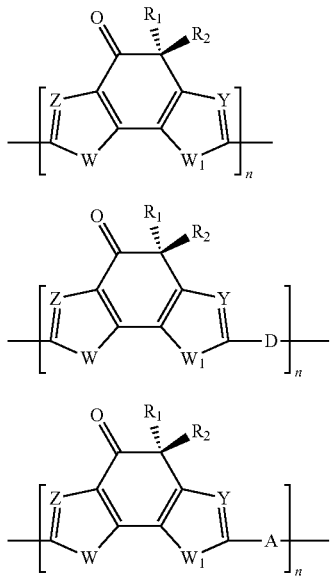

in which:
- W and $W_1$, identical or different, represent an oxygen atom; a sulfur atom; an N—$R_3$ group wherein $R_3$ represents a hydrogen atom, or is selected from linear or branched alkyl groups of $C_1$-$C_{20}$;
- Z and Y, identical or different, represent a nitrogen atom; or a C—$R_4$ group in which $R_4$ represents a hydrogen atom, or is selected from linear or branched $C_1$-$C_{20}$ alkyl groups, optionally substituted cycloalkyl groups, optionally substituted aryl groups, optionally substituted heteroaryl groups, linear or branched $C_1$-$C_{20}$ alkoxy groups, $R_5$—O—[$CH_2$—$CH_2$—O]$_n$— polyethylenoxy groups in which $R_5$ is selected from linear or branched $C_1$-$C_m$ alkyl groups, and n is an integer ranging from 1 to 4, —$R_6$—$OR_7$ groups in which $R_6$ is selected from linear or branched $C_1$-$C_{20}$ alkyl groups, and $R_7$ represents a hydrogen atom or is selected from linear or branched $C_1$-$C_{20}$ alkyl groups, or is selected from $R_5$—[—$OCH_2$—$CH_2$]$_n$— polyethylenoxy groups in which $R_5$ has the same meanings reported above and n is an integer ranging from 1 to 4, —$COR_8$ groups wherein $R_8$ is selected from linear or branched $C_1$-$C_{20}$ alkyl groups, $COOR_9$ groups in which $R_9$ is selected from linear or branched $C_1$-$C_{20}$ alkyl groups; or represent a —CHO group, or a cyano group (—CN);
- $R_1$ and $R_2$, identical or different, are selected from linear or branched $C_1$-$C_{20}$ alkyl groups; optionally substituted cycloalkyl groups; optionally substituted aryl groups; optionally substituted heteroaryl groups; linear or branched $C_1$-$C_{20}$ alkoxy groups; $R_5$—O—[$CH_2$—$CH_2$—O]$_n$— polyethylenoxy groups in which $R_5$ has the same meanings reported above and n is an integer ranging from 1 to 4; —$R_6$—$OR_7$ groups in which $R_6$ and $R_7$ have the same meanings reported above; —$COR_8$ groups in which $R_8$ has the same meanings reported above; —$COOR_9$ groups in which $R_9$ has the same meanings reported above; or represent a —CHO group, or a cyano group (—CN);
- D represents an electron donor group;
- A represents an electron acceptor group;
- n is an integer ranging from 10 to 500.

5. Polymer photovoltaic cell (or solar cell) with an inverted structure according to claim 1, wherein said organic electron acceptor compound is selected from:
fullerene derivatives; or
non-fullerene compounds, optionally polymeric.

6. Polymer photovoltaic cell (or solar cell) with an inverted structure according to claim 1, wherein said cathode buffer layer comprises zinc oxide, or titanium oxide.

7. Polymer photovoltaic cell (or solar cell) with an inverted structure according to claim 1, wherein said cathode is made of a material selected from: indium tin oxide (ITO), tin oxide doped with fluorine (FTO), zinc oxide doped with aluminum (AZO), and zinc oxide doped with gadolinium oxide (GZO); or it is constituted by grids of conductive material selected from silver (Ag), copper (Cu), graphite, and graphene, and by a transparent conductive polymer selected from PEDOT:PSS [poly(3,4-ethylenedioxythiophene):polystyrene sulfonate], and polyaniline (PANI); or it is constituted by a metal nanowire-based ink selected from silver (Ag), and copper (Cu).

8. Polymer photovoltaic cell (or solar cell) with an inverted structure according to claim 1, wherein said cathode is associated with a support layer which is made of rigid transparent material, or flexible material.

9. Polymer photovoltaic cell (or solar cell) with an inverted structure according to claim 1, wherein said at least one heteropoly acid is selected from heteropoly acids having general formula (I):

wherein:
- A represents a silicon atom, or a phosphorus atom;
- M represents an atom of a transition metal belonging to group 5 or 6 of the Periodic Table of the Elements, preferably selected from molybdenum, tungsten;
- x is an integer that depends on the valence of A;
- y is 12 or 18;
- z is 4 or 6.

10. Polymer photovoltaic cell (or solar cell) with an inverted structure according to claim 1, wherein said at least one heteropoly acid is selected from heteropoly acids having general formula (II):

wherein:
- A represents a silicon atom, or a phosphorus atom;
- x is an integer that depends on the valence of A;
- p is 6 or 10;
- q is 2 or 6.

11. Polymer photovoltaic cell (or solar cell) with an inverted structure according to claim 1, wherein said heteropoly acids having general formula (I) and said heteropoly acids having general formula (II) are selected from: phosphomolybdic acid hydrate {$H_3$[P($MoO_3$)$_{12}$$O_4$].n$H_2$O}, phosphomolybdic acid {$H_3$[P($MoO_3$)$_{12}$$O_4$]} in alcoholic solution, phosphotungstic acid hydrate {$H_3$[P($WO_3$)$_{12}$$O_4$].n$H_2$O}, phosphotungstic acid in alcoholic solution {$H_3$[P($WO_3$)$_{12}$$O_4$]}, silicomolybdic acid hydrate {$H_4$[Si($MoO_3$)$_{12}$$O_4$].n$H_2$O}, silicomolybdico acid {$H_4$[Si($MoO_3$)$_{12}$$O_4$]}, in alcohol solution, silicotungstic acid hydrate {$H_3$[Si($WO_3$)$_{12}$$O_4$].n$H_2$O}, silicotungstic acid {$H_3$[Si($WO_3$)$_{12}$$O_4$]}, in alcohol solution, phosphomolybdovanadic acid {$H_3$[P(Mo)$_6$(V)$_6$$O_{40}$].n$H_2$O}, phosphomolybdovanadic acid{$H_3$[P(Mo)$_6$(V)$_6$$O_{40}$]} in alcohol solution, phosphomolybdovanadic acid {$H_3[P(Mo)_{10}(V)_2O_{40}$} $nH_2O$}hydrate, phosphomolybdovanadic acid {$H_3[P(Mo)_{10}(V)_2O_{40}]$} in alcoholic solution, and mixtures thereof.

12. Polymer photovoltaic cell (or solar cell) with an inverted structure according to claim 1, wherein said at least one salt or a complex of a transition metal belonging to group 5 or 6 of the Periodic Table of the Elements with an organic anion or with an organic ligand, is selected from: bis(acetylacetonato)dioxomolybdenum (VI) (Cas No. 17524-05-9), molybdenum(VI) dioxide bis(2,2,6,6-tetramethyl-3,5-heptanedionate (Cas No. 34872-98-5), bis(tert-butylimido)(bis)(dimethylamido)molybdenum (VI) (Cas No. 923956-62-1), 2,6-di-iso-propylphenyl imido-neophilidene molybdenum (VI) bis(tert-butoxide) (Cas No. 126949-65-3), 2,6-di-iso-propylphenylimidoneophilidene molybdenum (VI) bis(hexafluoro-tert-butoxide) ("Schrock's catalyst") (Cas No. 139220-25-0), adduct of 2,6-di-iso-propylphenylimidoneophylidene-molybdenum (VI)bis(trifluoro-methanesulfonate) dimethoxyethane (Cas No. 126949-63-1), 2,6-di-iso-propylphenylimidoneophylidene-[racemic-BIPHEN] molybdenum (VI) ("rac-Schrock's-Hoveyda catalyst") (Cas No. 300344-02-9), 2,6-di-iso-propylphenylimidoneophylidene[R-(+)-BIPHEN]molybdenum (VI) ["(R) Schrock's-Hoveyda catalyst"] (Cas No. 329735-77-5), 2,6-di-iso-propylphenylimidoneophylidene [S-(−)BIPHEN]molybdenum (VI) ["(S) Schrock's-Hoveyda catalyst"] (Cas No. 205815-80-1), vanadium(V) oxytriisopropoxide (Cas No. 5588-84-1), bis(acetylacetonate) oxovanadium (IV) (Cas No. 3153-26-2), acetylacetonate of vanadium (III), tetrakis(dimethylamino)vanadium (IV) (Cas No. 19824-56-7), tetrakis (diethylamino)vanadium (IV) (Cas No. 219852-96-7), and mixtures thereof.

13. Polymer photovoltaic cell (or solar cell) with an inverted structure according to claim 1, wherein the organic solvent is an alcohol selected from: methanol, ethanol, trifluoroethanol, n-propanol, iso-propanol, hexafluoro-iso-propanol, n-butanol, and mixtures thereof.

14. Polymer photovoltaic cell (or solar cell) with an inverted structure according to claim 1, wherein the organic solvent is a ketone selected from: cyclohexanone, acetone, methyl ethyl ketone, and mixtures thereof.

15. Polymer photovoltaic cell (or solar cell) with an inverted structure according to claim 1, in which the organic solvent is an ester selected from: butyrolactone, ethyl acetate, propyl acetate, butyl acetate, ethyl butyrate, and mixtures thereof.

16. Polymer photovoltaic cell (or solar cell) with an inverted structure according to claim 1, wherein said process is conducted at a temperature ranging from 25° C. to the boiling point of the solvent used, and for a time ranging from 15 minutes to 8 hours.

17. Process for the preparation of the polymer photovoltaic cell (or solar cell) with an inverted structure according to claim 1, comprising:
forming the cathode by sputtering; or via electron beam assisted deposition; or through deposition of a conductive transparent polymer via spin coating, or gravure printing, or flexographic printing, or slot die coating, preceded by the deposition of grids of conductive material by evaporation, or screen-printing, or spray-coating, or flexographic printing; or by deposition of a metal nanowire-based ink via spin coating, or gravure printing, or flexographic printing, or slot die coating;
forming the cathode buffer layer by spin coating, or gravure printing, or flexographic printing, or slot die above said cathode;
forming the active layer via spin coating, or gravure printing, or slot-die, above said cathode buffer layer;
forming the second anode buffer layer by spin coating, or gravure printing, or screen-printing, or flexographic printing, or slot-die above said active layer;
forming the first anode buffer layer by spin coating, or gravure printing, or screen-printing, or flexographic printing, or slot-die, above said second anode buffer layer;
forming the anode by vacuum evaporation, or screen-printing, or spray-coating, or flexographic printing, above said first anode buffer layer; or by deposition of a conductive transparent polymer via spin coating, or gravure printing, or flexographic printing, or slot die coating, followed by deposition of grids of conductive material by evaporation, or screen-printing, or spray-coating, or flexographic printing, above said first anode buffer layer; or by deposition of an metal nanowire-based ink via spin coating, or gravure printing, or flexographic printing, or slot die coating, above said first anode buffer layer.

18. Polymer photovoltaic cell (or solar cell) with an inverted structure according to claim 1, wherein:
the anode has a thickness ranging from 50 nm to 150 nm;
the first anode buffer layer has a thickness ranging from 10 nm to 2000 nm;
the second anode buffer layer has a thickness ranging from 1 nm to 100 nm;
the active layer has a thickness ranging from 50 nm to 500 nm;
the cathode buffer layer has a thickness ranging from 10 nm to 100 nm;
the cathode has a thickness ranging from 50 nm to 150 nm.

19. The polymeric photovoltaic cell (or solar cell) with an inverted structure according to claim 4, wherein the photoactive organic polymer is selected from the group consisting of PffBT4T-20D {poly[(5,6-difluoro-2,1,3-benzothiadiazole-4,7-diyl)-alt-(3,3'''-(2-octyldodecyl)-2,2';5',2'';5'',2'''-quaterthiophene-5,5'''-diyl)]}, PBDTTPD {{poly pyrrole-1,3-diyl][4,8-bis [(2-ethylhexyl)oxy]benzo-[1,2-b:4,5-b'] dithiophene-2,6-diyl]}, poly{PTB7({4,8-bis [(2-ethylhexyl) oxy]-benzo[1,2-b:4,5-b']dithiophene-2,6-diyl} {3-fluoro-2-[(2-ethylhexyl)carbonyl]-thieno[3,4-b]thiophendiyl})}, more preferably PTB7 {poly({4,8 bis[(2-ethylhexyl)oxy]-benzo[1,2-b:4,5-b']dithiophene-2,6-diyl}{3-fluoro-2-[(2-ethylhexyl)carbonyl]-thieno[3,4-b]thiophendiyl})}.

* * * * *